(12) United States Patent
Fagan et al.

(10) Patent No.: US 8,193,846 B2
(45) Date of Patent: Jun. 5, 2012

(54) SELECTABLE DELAY PULSE GENERATOR

(75) Inventors: John L. Fagan, Pasadena, MD (US);
Mark Bossard, Upper Marlboro, MD (US)

(73) Assignee: Atmel Corporation, San Jose, CA (US)

( * ) Notice: Subject to any disclaimer, the term of this patent is extended or adjusted under 35 U.S.C. 154(b) by 16 days.

(21) Appl. No.: 12/510,200

(22) Filed: Jul. 27, 2009

(65) Prior Publication Data

US 2009/0284296 A1    Nov. 19, 2009

Related U.S. Application Data

(63) Continuation of application No. 10/961,584, filed on Oct. 8, 2004, now abandoned.

(60) Provisional application No. 60/510,748, filed on Oct. 10, 2003.

(51) Int. Cl.
*H03H 11/26* (2006.01)
(52) U.S. Cl. .......................... 327/276; 327/277
(58) Field of Classification Search .................. 327/261, 327/262, 276–278, 281
See application file for complete search history.

(56) References Cited

U.S. PATENT DOCUMENTS

| | | | |
|---|---|---|---|
| 3,937,936 A | 2/1976 | Saporito et al. | |
| 4,748,595 A | 5/1988 | Mattausch et al. | |
| 4,797,585 A | 1/1989 | Segawa et al. | |
| 4,797,586 A | 1/1989 | Traa | |
| 5,144,174 A | 9/1992 | Murakami | |
| 5,237,224 A | 8/1993 | DeLisle et al. | |
| 5,243,227 A | 9/1993 | Gutierrez, Jr. et al. | |
| 5,243,240 A | 9/1993 | Murakami et al. | |
| 5,316,171 A | 5/1994 | Danner et al. | |
| 5,376,849 A | 12/1994 | Dickol et al. | |
| 5,418,756 A | 5/1995 | McClure | |
| 5,444,666 A | 8/1995 | Oh | |
| 5,459,422 A | 10/1995 | Behrin | |
| 5,479,128 A | 12/1995 | Jan et al. | |
| 5,487,048 A * | 1/1996 | McClure | 365/207 |
| 5,493,241 A | 2/1996 | Landry et al. | |
| 5,502,672 A | 3/1996 | Kwon | |
| 5,594,690 A | 1/1997 | Rothenberger et al. | |
| 5,596,538 A | 1/1997 | Joo | |

(Continued)

FOREIGN PATENT DOCUMENTS

WO    WO-2005036747 A2    4/2005

(Continued)

OTHER PUBLICATIONS

"8:1 MUX/DEMUX BusSwitch Data Sheet", *Pericom Semiconductor Corp.*, (1996), 1-3.

(Continued)

*Primary Examiner* — Quan Tra
(74) *Attorney, Agent, or Firm* — Fish & Richardson P.C.

(57) ABSTRACT

A programmable pulse generator having a clock signal delay chain, multiplexer, and reduced voltage charge circuit. The clock delay chain comprises a plurality of propagated delays, coupled to the multiplexer. The multiplexer selects a particular clock delay signal from a plurality of delay chain taps. The multiplexer is driven by a tap select register coupled to a state machine. The state machine controls the programmable pulse output, encoding the data by varying the pulse width and delay between pulses. The delay of pulse outputs from the multiplexer are reduced by coupling a reduced voltage pre-charge circuit to the multiplexer.

15 Claims, 2 Drawing Sheets

U.S. PATENT DOCUMENTS

| | | |
|---|---|---|
| 5,646,904 A | 7/1997 | Ohno et al. |
| 5,684,809 A | 11/1997 | Stave et al. |
| 5,757,713 A | 5/1998 | Gans et al. |
| 5,757,718 A | 5/1998 | Suzuki |
| 5,777,501 A | 7/1998 | AbouSeido |
| 5,793,688 A | 8/1998 | McLaury |
| 5,801,985 A | 9/1998 | Roohparvar et al. |
| 5,812,148 A | 9/1998 | Takasugi et al. |
| 5,841,789 A | 11/1998 | McClure |
| 5,852,379 A | 12/1998 | Jiang |
| 5,880,996 A | 3/1999 | Roohparvar |
| 5,889,726 A | 3/1999 | Jeddeloh |
| 5,892,720 A | 4/1999 | Stave et al. |
| 5,898,635 A | 4/1999 | Raad et al. |
| 5,930,182 A | 7/1999 | Lee |
| 5,978,286 A | 11/1999 | Chang et al. |
| 6,052,011 A | 4/2000 | Dasgupta |
| 6,061,296 A | 5/2000 | Ternullo, Jr. et al. |
| 6,074,698 A | 6/2000 | Sakurai et al. |
| 6,087,855 A * | 7/2000 | Frederick et al. ............ 326/106 |
| 6,111,796 A | 8/2000 | Chang et al. |
| 6,150,863 A | 11/2000 | Conn et al. |
| 6,177,807 B1 | 1/2001 | Bertin et al. |
| 6,286,118 B1 | 9/2001 | Churchill et al. |
| 6,288,585 B1 * | 9/2001 | Bando et al. .................. 327/156 |
| 6,352,591 B1 | 3/2002 | Yieh et al. |
| 6,438,043 B2 | 8/2002 | Gans et al. |
| 6,486,712 B1 * | 11/2002 | Landry et al. .................. 327/99 |
| 7,072,433 B2 * | 7/2006 | Bell .............................. 375/376 |
| 2001/0052046 A1 | 12/2001 | Afghahi et al. |
| 2002/0004892 A1 | 1/2002 | Gans et al. |
| 2002/0135761 A1 | 9/2002 | Powell et al. |
| 2005/0077941 A1 | 4/2005 | Fagan et al. |

FOREIGN PATENT DOCUMENTS

| WO | WO-2005036747 A3 | 4/2005 |
|---|---|---|

OTHER PUBLICATIONS

"International Application Serial No. PCT/US2004/033341, International Search Report mailed Oct. 5, 2004", 1 pg.

\* cited by examiner

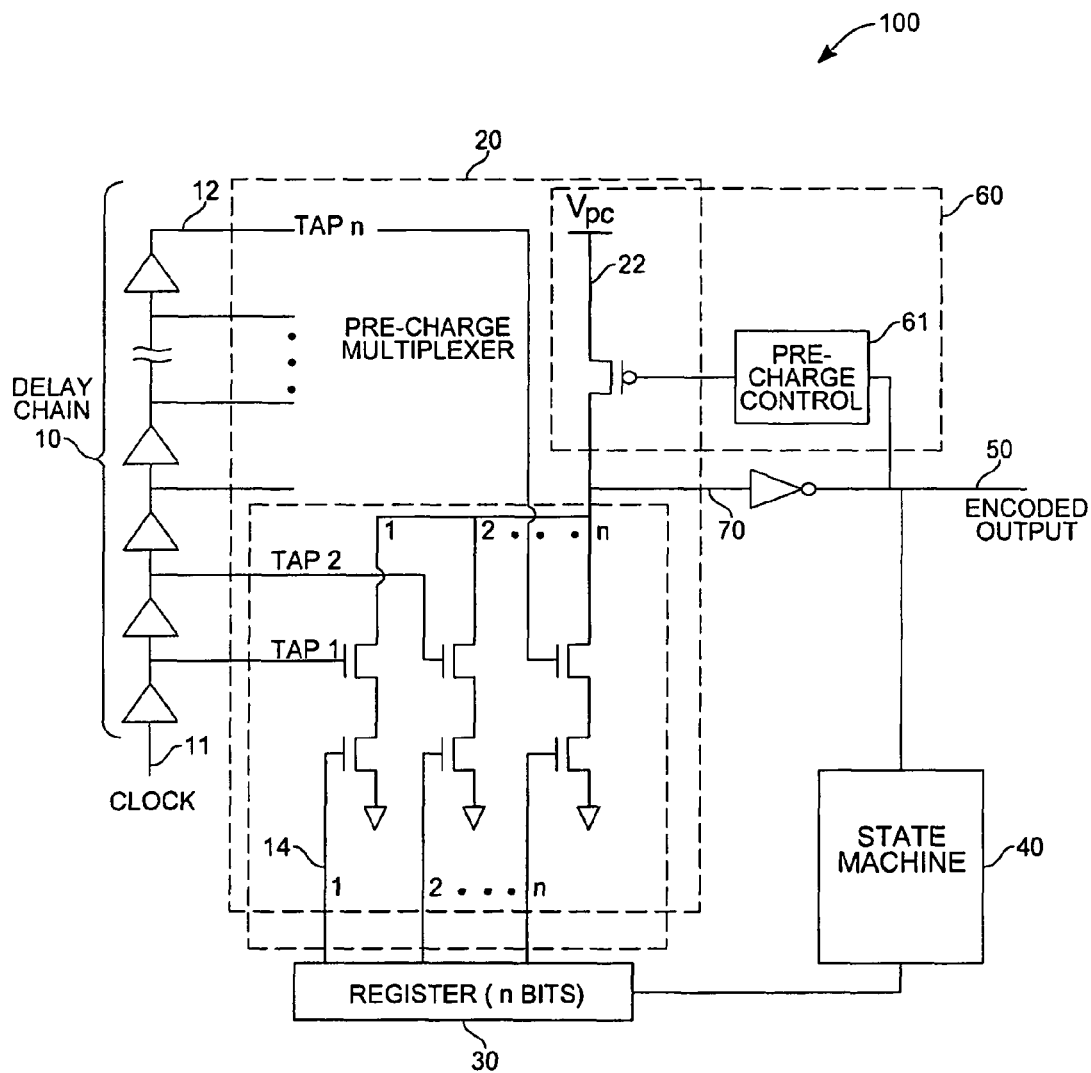
Fig._1

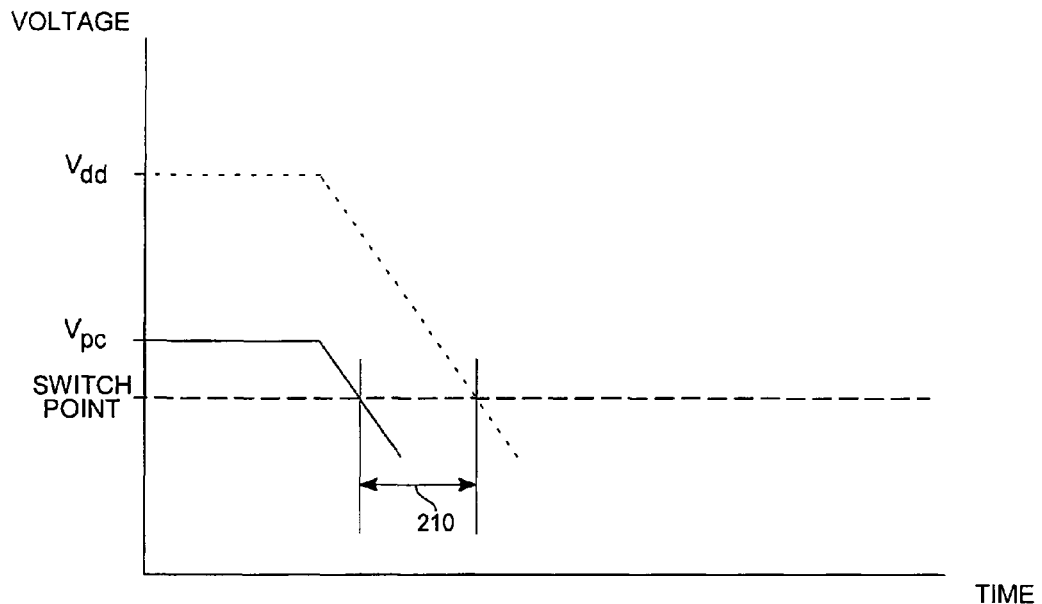
Fig._2
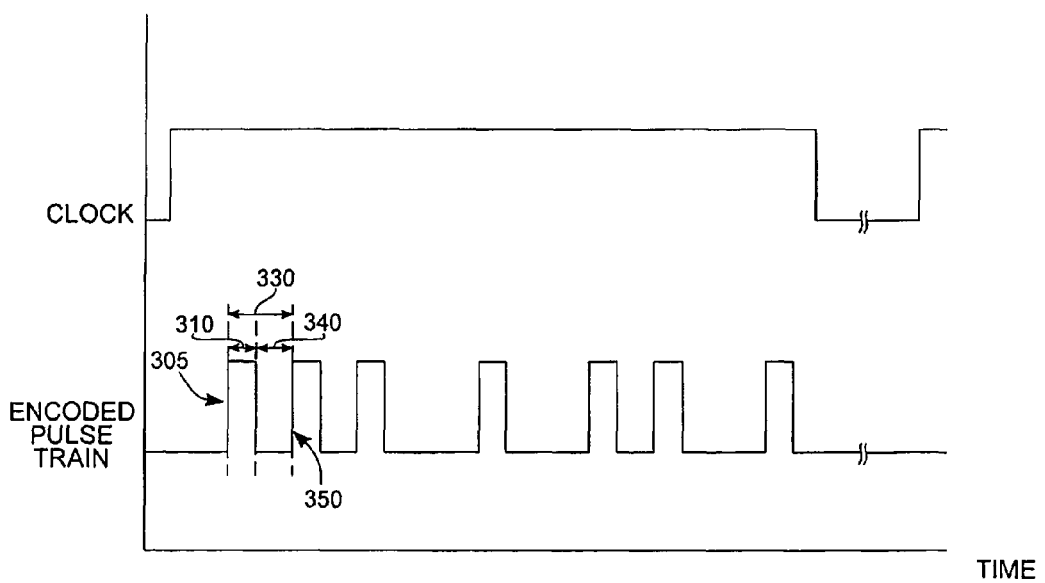
Fig._3

SELECTABLE DELAY PULSE GENERATOR

CROSS-REFERENCE TO RELATED APPLICATION

This application is a Continuation of U.S. application Ser. No. 10/961,584, filed Oct. 8, 2004, which claims priority from Provisional Application No. 60/510,748 filed Oct. 10, 2003, both of which are incorporated herein by reference in their entirety.

TECHNICAL FIELD

The present invention relates to a pulse generator having selectable delays between pulses. The selectable delays provide a pulse train output.

BACKGROUND ART

Programmable delay circuits have been used in a variety of applications, for example, in testing and in memory configurations. A variety of digital designs and techniques are available for controlling the delay steps and pulse widths of an output signal. Prior art circuits suffer from the disability to quickly switch a delay from the clock chain for accuracy or precise timing needs, or for pure data speed or throughput increase. For example, U.S. Pat. No. 5,594,690 to Rothenberger et al., entitled "Integrated circuit memory having high speed and low-power by selectively coupling compensation components to a pulse generator," Rothenberger describes a major problem with existing circuits not having predictable switching speeds, and large delay tolerances. An object of the Rothenberger invention is to provide faster operating speeds and smaller power dissipation. With the overall need to build faster circuits in a variety of areas, pulse generator designs must evolve and improve. This requirement may be met by building faster digital devices or by implementing new design ideas to reduce delay within any system that requires variable pulse outputs or variable pulse widths. A speed or throughput increase also provides an increase in bandwidth as the rate or density of data increases.

SUMMARY OF THE INVENTION

The present invention is a selectable delay pulse generator, which is designed to create a pulse train with a delay between pulses, or pulse edges, representing encoded data. The present invention significantly increases the bandwidth within a given clock cycle by utilizing a delay chain with taps fed to a reduced voltage pre-charge multiplexer using an automatic pre-charge control circuit. The multiplexer selects an output from the delay chain, and quickly switches the pulse generator output with the aid of a reduced voltage pre-charge circuit.

The delay chain is made of individual delay elements, where the speed of each element may be governed by a current mirror.

A multiplexer is coupled to and controlled by an n-bit register that is coupled to the output of a state machine. In general, the state machine output is determined by a transition function and the state of an input to the state machine. In some embodiments, the state machine 40 may include a counter, a state mapping function, and a plurality of output states. It is preferred that the state machine circuitry is implemented on the same IC (integrated circuit) with the other pulse generator circuits. However, the state machine may be implemented in hardware, for example an different integrated circuit, by software, or by other control signals.

Increased speed and, consequently, increased bandwidth, are due to a reduced delay through the reduced voltage pre-charge multiplexer and the relaxed timings allowed by the shortened pulses of the automatic pre-charge circuit. A minimum delay increment can be shorter in time, more encoded pulses per clock period, or a faster clock period, (or a combination) may be implemented and the encoding system can be faster.

BRIEF DESCRIPTION OF THE DRAWINGS

FIG. 1 is a schematic of an exemplary embodiment of a delay pulse circuit.

FIG. 2 is a timing diagram indicating the reduced delay time due to a reduced voltage pre-charge circuit of the exemplary pulse circuit of FIG. 1.

FIG. 3 is a timing diagram, indicating the reduced timing parameters in an encoded pulse train of the exemplary pulse circuit of FIG. 1.

DETAILED DESCRIPTION OF THE INVENTION

The exemplary selectable delay pulse generator 100 of FIG. 1 uses a delay chain 10 combined with a reduced voltage pre-charge multiplexer 20 with an automatic pre-charge circuit 60. This combination provides an increase in maximum bandwidth for encoded data within a given clock period of clock input 11. The use of a reduced voltage pre-charge significantly decreases the delay of the tap 12 to multiplexer output 70, allowing a state machine 40 controlling the selected taps more time to operate. Therefore, the pulse generator 100 is able to run at a higher speed or have a higher density of encoded data pulses within a given clock cycle. The automatic pre-charge circuit 60 creates a short pulse width which additionally relaxes timing requirements for the state machine 40.

A clock of known frequency is connected to the clock input 11 and to the delay chain 10. In a specific embodiment, the selectable delay pulse generator 100 consists of a current controllable delay chain 10 with a plurality of n output taps 12 (for example, 48 taps). An optimized delay chain will contain as many delay elements to provide as many delay intervals as possible with in a single clock period. Generally, the delay chain provides rising or falling edges at regular selectable intervals. In one embodiment, the delay chain is a current controlled delay. The delay chain 10 is made of individual delay elements, where the speed or delay interval of each element may be controlled, for example by an ADC (analog-to-digital converter) driven current mirror. Also, in another embodiment, a control loop may be used to set the current mirror, for example from between 10-100 microAmps, therefore setting the delay chain speed. Adjusting the delay chain speed may be used to calibrate the delay chain delay to an external clock. In addition, adjusting the delay chain speed may be used to counter act variations in process, temperature, or voltage. The output taps 12 coupled to the delay chain 10 are selectable by a pre-charge multiplexer 20 having individual (tap) selects 14 for each output tap 12. The output taps 12 are controlled by an n-bit register 30.

A delay between pulses output by the pulse generator 100 is a function of the data to be encoded by the state machine 40. Generally, the state machine 40 receives the data to be encoded, determines the next tap to be selected, and selects the tap when triggered. The encoding method depends on the encoding scheme. An exemplary encoding scheme is shown in the chart below (where T is the current tap number):

| Data In | Delay | Next Tap Selection (2 ns per tap) |
|---|---|---|
| 00 | 4 ns | T + 2 |
| 01 | 6 ns | T + 3 |
| 10 | 8 ns | T + 4 |
| 11 | 10 ns | T + 5 |

The actual pulse is created by the rising edge of the clock input 11 moving through the delay chain 10 as it is observed through the output taps 12, which shift as the clock moves through the delay chain 10. The state machine 40, controlling the pre-charge multiplexer 20 through a register 30 having a pre-selected number of bits, couples at least one output tap 12 to the encoded output line 50, to define the time location of critical signal edges (rising or falling) of the encoded pulse train output. In one embodiment, the encoded pulse train output is provided to the input of the state machine 40, which is then triggered to change its state and select a new output tap 12. The state machine 40 must be able to select or couple the new output tap to the encoded output 50 before the clock edge that propagates through the delay chain 10 reaches the new output tap 12 that is to be selected. The minimum encoded delay time increment must be greater than the amount of time it takes for the output tap signal edge to travel from the output tap 12 to the encoded output line 50, in addition to the amount of time it takes for the state machine 40, tap register 30, and pre-charge multiplexer 20 to select the next output tap 12.

Referring to FIGS. 1 and 2, a novel feature of the pulse generator is the reduced voltage pre-charge multiplexer 20 having an automatic pre-charge circuit 60 operating at a lower voltage $V_{pc}$ than the supply voltage $V_{dd}$. The reduced voltage pre-charge of the multiplexer reduces the above mentioned time delay and allows the encoder to operate faster. For example $V_{pc}$=1.8 volts when used with a supply voltage $V_{dd}$=2.85 volts. The automatic pre-charge circuit 60 uniformly completes each pulse started by the signal on the selected output tap. In an exemplary embodiment, the pre-charge circuit 22 is coupled to a pre-charge control 61. The pre-charge control 61 is also coupled to the encoded output 50 of the state machine. In one embodiment the pre-charge control 61 delays the encoded output signal to define the pulse width (310 in FIG. 3) of the encoded output 50. In an alternate embodiment, the pre-charge control 61 may dynamically adjust the pulse width.

The reduced voltage pre-charge circuit allows a faster switch point due to the reduced voltage of $V_{pc}$ thus providing a reduced switch delay time from a selected output of tap 12 to the multiplexer output 70. The reduced switch delay time relieves the state machine 40 from having to complete the entire duration of each pulse before starting the next output tap 12 selection. The faster the output is generated from the delay chain 10 edge at the output tap 12, the faster the state machine 40 will be triggered to shift into the next select state. The circuit provides the following advantages:

1. A reduced delay time 210, as shown in FIG. 2, from a selected output tap 12, through the multiplexer 20 allows more time for the state machine 40 to process new data and switch to a next state. This shortened delay time allows using a smaller pulse width 310, as shown in FIG. 3, as the minimum encoded output value on encoded output 50 allows for greater bandwidth savings (i.e., more pulses per period).

2. A short pulse width 310, as shown in FIG. 3, is generated at the encoded output 50 instead of simply routing out the selected output tap, thereby relaxing the timing requirements on the tap-selecting state machine 40.

In an exemplary resulting output, as shown in FIG. 3, the pulse generator 100 encodes data into a pulse stream having pre-selected separations between each pulse. When a selected tap is routed through the multiplexer, the output of the delay chain/multiplexer would be a delayed pulse having a rising edge 305 of the delayed clock pulse. The output would stay high until the next state change. The multiplexer output state needs to change quickly enough (e.g., within a cycle 330) to select the next desired output tap from $tap_1$ to $tap_n$ of the propagation delayed clock edge. The multiplexer output must complete a prior state switch, for example, well before the next desired state change 350 reaches output $tap_x$ in the delay chain. In this diagram, the multiplexer has switched quickly enough to allow a falling edge within the time period 310. The multiplexer delay also allows a proper setup time 340 before the next desired rising edge 350. This would introduce a set up requirement equal to the minimum allowed low pulse on a flip-flop's clock (not shown).

By having the multiplexer output a short pulse 310 by utilizing an automatic pre-charge circuit, a minimum pulse width is allowed and the state machine 40 does not need to account for a longer set-up time. The exemplary selectable delay pulse generator effectively has a substantially reduced set-up time requirement between a tap selection and the clock edge arriving at the output tap to be selected.

It is to be understood that the above description is intended to be illustrative, and not restrictive. Many other embodiments will be apparent to those of skill in the art upon reading an understanding the above description. The scope of the invention should, therefore, be determined with reference to the appended claims, along with the full scope of equivalents to which said claims are entitled.

What is claimed is:

1. An apparatus comprising:
   a delay chain to generate a plurality of delayed signals from a clock signal that propagates through the delay chain, the delay chain having a plurality of taps for the delayed signals including a first tap closer to a clock signal input than a second tap, the clock signal being powered by a supply voltage of the apparatus;
   a multiplexer to sequentially couple selected delayed signals of the plurality of delayed signals to an output line with a pre-charge voltage that is lower than the supply voltage of the apparatus; and
   a pre-charge controller including:
     an input coupled to the output line; and
     an output responsive to each edge of the selected delayed signals;
   wherein the pre-charge controller is configured to vary a delay between edges of the selected delayed signals, and wherein the pre-charge voltage is selected to reduce a switch delay time from the taps of the delay chain to the output line compared to a supply voltage delay time based on the supply voltage, and the multiplexer is configured based on the reduced switch delay time to couple a clock edge at the second tap of the delay chain to the output line after coupling the clock edge at the first tap of the delay chain to the output line before the clock edge reaches the second tap of the delay chain.

2. The apparatus of claim 1, wherein the pre-charge controller is configured to couple the pre-charge voltage to the multiplexer.

3. The apparatus of claim 1, wherein the pre-charge controller is configured to control a coupling between the pre-charge voltage and the multiplexer.

4. The apparatus of claim 1, wherein:
the delay chain comprises a plurality of current controlled elements and a plurality of taps, each tap being coupled to one of the current controlled elements; and
the delay chain is coupled to receive a clock signal to generate the plurality of delayed signals from the current controlled elements, each delayed signal comprising a signal edge, the multiplexer to couple one of the signal edges from one of the taps to the output line.

5. The apparatus of claim 4, further comprising a state machine coupled to select taps in the delay chain by controlling the multiplexer through a register to generate a pulse train on the output line with delays between pulses in the pulse train representing encoded data.

6. The apparatus of claim 1, wherein the pre-charge voltage is 1.8 volts and the supply voltage is 2.85 volts.

7. An apparatus comprising:
an output;
a delay chain to generate a plurality of delayed signal edges from a clock signal that propagates through the delay chain, the delay chain having a plurality of taps for the delayed signal edges including a first tap closer to a clock signal input than a second tap, the clock signal being powered by a supply voltage of the apparatus;
a multiplexer coupled to select one of the delayed signal edges; and
a pre-charge circuit having an input coupled to the output, the pre-charge circuit configured to complete a pulse started by the selected one of the plurality of delayed signal edges;
a pre-charge transistor having a first node directly coupled to a pre-charge voltage, a second node coupled to the output, and a control node coupled to the output of the pre-charge circuit, the pre-charge transistor configured to couple and decouple the output to the pre-charge voltage responsive to the output of the pre-charge circuit; and
wherein the pre-charge voltage is lower than the supply voltage of the apparatus, and wherein the pre-charge voltage is selected to reduce a switch delay time from the taps of the delay chain to the output compared to a supply voltage delay time based on the supply voltage, and the multiplexer is configured based on the reduced switch delay time to couple a clock edge at the second tap of the delay chain to the output line after coupling the clock edge at the first tap of the delay chain to the output line before the clock edge reaches the second tap of the delay chain.

8. The apparatus of claim 7, wherein the pre-charge transistor is configured to couple the pre-charge voltage to the multiplexer.

9. The apparatus of claim 7, wherein the multiplexer is coupled between the delay chain and an output line to couple the selected delayed signal edge from the delay chain to the output line.

10. The apparatus of claim 7, wherein the pre-charge voltage is 1.8 volts and the supply voltage is 2.85 volts.

11. A method comprising:
generating a plurality of delayed signals in a delay chain in an integrated circuit from a clock signal that propagates through the delay chain, the delay chain having a plurality of taps for the delayed signals including a first tap closer to a clock signal input than a second tap, the clock signal being powered by a supply voltage of the integrated circuit;
sequentially coupling selected delayed signals of the plurality of delayed signals to an output line of the integrated circuit using a multiplexer;
receiving the selected delayed signals at an input of a pre-charge circuit;
coupling the output line of the integrated circuit with a pre-charge voltage that is lower than the supply voltage of the integrated circuit in response to an output of the pre-charge circuit, wherein the pre-charge voltage is selected to reduce a switch delay time from the taps of the delay chain to the output line compared to a supply voltage delay time based on the supply voltage; and
uncoupling the output line from the pre-charge voltage in a time based on the reduced switch delay time to couple a clock edge at the second tap of the delay chain to the output line after coupling the clock edge at the first tap of the delay chain to the output line before the clock edge reaches the second tap of the delay chain.

12. The method of claim 11, wherein coupling the output line further comprises:
pre-charging the multiplexer with the pre-charge voltage.

13. The method of claim 11, wherein generating a plurality of delayed signals further comprises:
generating a plurality of delayed signal edges from a plurality of taps between a plurality of delay elements in the delay chain; and
controlling a delay interval of each delay element with a current mirror.

14. The method of claim 11, further comprising controlling the multiplexer with a state machine through a register to select taps in the delay chain to generate a pulse train on the output line with delays between pulses in the pulse train representing the encoded data.

15. The method of claim 11, wherein the pre-charge voltage is 1.8 volts and the supply voltage is 2.85 volts.

* * * * *

UNITED STATES PATENT AND TRADEMARK OFFICE
CERTIFICATE OF CORRECTION

PATENT NO. : 8,193,846 B2
APPLICATION NO. : 12/510200
DATED : June 5, 2012
INVENTOR(S) : John L. Fagan and Mark A. Bossard It is certified that error appears in the above-identified patent and that said Letters Patent is hereby corrected as shown below:

Cover Page, (75) Inventors, Col. 1, delete "Mark Bossard," and insert -- Mark A. Bossard, --

Signed and Sealed this
Fourteenth Day of August, 2012

David J. Kappos
*Director of the United States Patent and Trademark Office*